United States Patent [19]

Newby et al.

[11] 3,926,747

[45] Dec. 16, 1975

[54] SELECTIVE ELECTRODEPOSITION OF GOLD ON ELECTRONIC DEVICES

[75] Inventors: Kenneth Russ Newby, Greensboro, N.C.; Earl Dallas Winters, Quakertown, Pa.

[73] Assignee: Bell Telephone Laboratories, Incorporated, Murray Hill, N.J.

[22] Filed: Feb. 19, 1974

[21] Appl. No.: 443,624

[52] U.S. Cl. ................ 204/15; 204/40; 204/DIG. 7
[51] Int. Cl.$^2$........................ C25D 5/02; C25D 5/10
[58] Field of Search.................... 204/15, 40, DIG. 7

[56] References Cited

UNITED STATES PATENTS

| | | | |
|---|---|---|---|
| 1,750,418 | 3/1930 | McFarland | 204/18 R |
| 1,862,231 | 6/1932 | McFarland | 204/18 R |
| 2,367,314 | 1/1945 | Russell | 204/18 R |
| 3,122,817 | 3/1964 | Andrus | 29/25.3 |
| 3,274,670 | 9/1966 | Lepselter | 29/155.5 |
| 3,287,612 | 11/1966 | Lepselter | 317/235 |
| 3,388,048 | 6/1968 | Szabo, Jr. | 204/15 |
| 3,514,379 | 5/1970 | Neill | 204/15 |
| 3,663,279 | 5/1972 | Lepselter | 117/212 |
| 3,708,403 | 1/1973 | Koger | 204/15 |
| 3,809,625 | 5/1974 | Brown et al. | 204/15 |

*Primary Examiner*—T. M. Tufariello
*Attorney, Agent, or Firm*—P. V. D. Wilde; G. S. Indig

[57] ABSTRACT

In metallizing semiconductor devices of the beam-lead type, electrode and connector surfaces are fabricated by depositing a first layer of titanium on the semiconductor surface, followed by depositing a second layer of either platinum or palladium on the titanium. After a photoresist step in which the second layer is patterned to bare portions of the titanium layer, gold is then selectively electrodeposited on the second layer by limiting the maximum potential that may be attained during plating. Masking the titanium layer during gold electrodeposition is thereby avoided.

9 Claims, 5 Drawing Figures

SELECTIVE ELECTRODEPOSITION OF GOLD ON ELECTRONIC DEVICES

BACKGROUND OF THE INVENTION

1. Field of the Invention

The invention relates to the fabrication of devices, including integrated circuits, where plating is employed to form electrode contacts and connections.

2. Description of the Prior Art

In the prior art of metallizing silicon integrated circuit devices, M. P. Lepselter (U.S. Pat. No. 3,287,612, issued Nov. 22, 1966) teaches that in making contact to silicon, the entire surface is oxidized and holes are then etched through the silicon oxide layer to the underlying silicon. A thin layer of platinum is then deposited on the exposed silicon and is heated to form a platinum silicide contact. Next, a refractory metal such as titanium is deposited onto the entire surface. Following deposition of titanium, a layer of platinum is deposited directly over titanium. At this stage in the process, the entire platinum surface is coated with an organic film photoresist and, practicing well-known photolithographic techniques, a desired electrode and connection pattern is defined on the platinum surface. Gold is then electrodeposited on the exposed electrode and connection regions. The excess platinum and titanium are subsequently removed by backsputtering, using the gold regions as a mask.

More recent refinements of the above process have shown that (a) palladium may be employed in place of platinum and (b) the desired electrode and connection pattern may alternatively be defined on the platinum surface by removing undesired platinum, using photolithographic and acid-etching techniques, leaving portions of the titanium surface exposed. A second photoresist layer is then applied to the entire metallic surface and is processed to bare only the platinum regions and to cover completely the exposed titanium regions. Gold is then electrodeposited only on the bared platinum regions. As is well-known in the art, the electrodeposition is commonly performed under conditions of controlled current. The remaining portions of the photoresist and titanium layers are subsequently removed by well-known chemical dissolution techniques.

The Lepselter process and its modifications for metallizing silicon integrated circuits have found general acceptance in the semiconductor industry, and the circuits so fabricated are generally quite satisfactory. However, it has been noted that during electrodeposition, gold plating on the titanium surface occurs along the platinum-titanium interface, resulting in decreased definition of conductor surfaces. Only in recent years has this problem become important, where a reduction of circuit dimensions, e.g., to accommodate high frequency applications, has necessitated closer placement of conducting surfaces and a higher packing density of devices on circuit chips. The close physical placement of conducting surfaces means that adjacent conductors may be short-circuited by the extension of the gold plating from one platinum conducting surface to the next.

SUMMARY OF THE INVENTION

In accordance with the invention, increased definition of conducting surfaces is obtained by use of an electrodeposition procedure that results in selective plating of gold only onto platinum or palladium, with substantially no plating of gold onto titanium. Such plating is achieved by limiting the maximum potential that may be achieved during electrodeposition. A three-electrode system employed a potentiostat is convenient for controlling the potential.

As noted in the Prior Art section above, the problem of gold plating onto titanium has been observed along the platinum-titanium interface as underplating of a photoresist layer covering the titanium surface. However, the problem of such gold plating exists whether the photoresist layer is present or absent. Consistent with this, the invention result obtains whether or not the titanium surface is protected by a photoresist layer.

DETAILED DESCRIPTION OF THE INVENTION

1. Metallization Procedure

Figure 1:
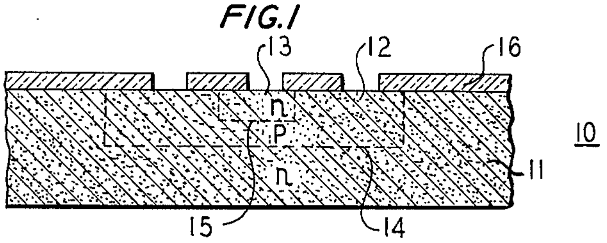
FIGS. 1 through 5 depict, the in cross-section, a portion of a device, here a semiconductor slice including diffused regions defining junctions, as it is processed in the formation of circuit patterns, including electrode contacts and connections, in accordance with the invention.

FIG. 1 illustrates an example of a semiconductor device 10 in which body 11 is a portion of a semiconductor slice from which an array of semiconductor devices are fabricated. By previous processing steps using well-known masking and diffusion techniques, conductivity-type zones 12 and 13 corresponding to base and emitter, respectively, have been made. These zones are defined by junctions 14 and 15. A masking layer 16 of silicon dioxide ($SiO_2$) is formed on the surface of the body and is apertured to define contact areas for providing electrodes to the p-type base region 12 and the n-type emitter region 13. Standard photolithographic and etching techniques are employed in baring the underlying silicon surface and thus do not form a necessary part of this disclosure; see, e.g., J. Andrus, U.S. Pat. No. 3,122,817, issued Mar. 3, 1964.

The description of the metallization procedure that follows is generally in accord with that taught by Lepselter and mentioned in the Prior Art section, but with the modifications introduced by the present invention. Those portions of the description attributed to Lepselter are set forth to provide as background information only and do not form a part of this invention. The limits on the thickness of the metallization layers are intended to be merely exemplary. The purity of all materials described is that found in normal commercial practice. The deposited metals, for example, typically are 99.99 percent pure; however, the purity of gold may be as low as about 99 percent, the balance constituting mainly hardening agents.

First, a thin layer of platinum (about a few hundred Angstroms) (not shown) is deposited, such as by sputtering, over the entire surface, and is then heated briefly to sinter the platinum with silicon to form a good electrical contact to the silicon exposed through the apertures. Then, the platinum is removed from the oxide areas by rinsing the entire slice in aqua regia. The process is described more fully in M. P. Lepselter, U.S. Pat. No. 3,274,670, issued Sept. 27, 1966.

Figure 2:
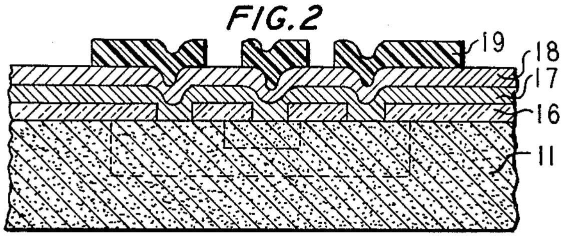
Figure 3:
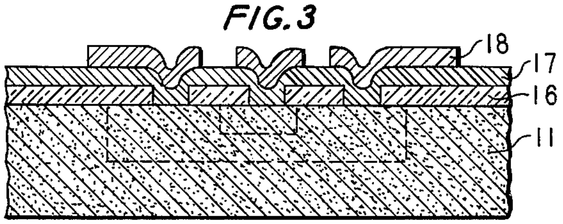

Next, as shown in FIG. 2, a layer 17 of titanium (about 0.15 micrometers to 0.3 micrometers in thickness) is deposited on the entire surface of the body 11. Following deposition of the titanium layer, a second metallic layer 18 of platinum (about 0.15 micrometers to 0.3 micrometers in thickness) is deposited on the entire surface. Both the titanium and the platinum depositions are conveniently performed by well-known vacuum deposition techniques, such as sputtering or electron-gun vacuum evaportion. As is conventional, a photoresist layer 19 is then used to define the desired electrode and connection patterns in the platinum layer, as shown in FIG. 3.

A third metallic layer 20 of gold is formed on the remaining regions of the platinum layer 18 by electrodeposition. In accordance with the invention and departing from the prior art, the potential is limited to a maximum value, as described more fully below. For the usual device fabrication, the gold layer is deposited to a thickness of about 1 micrometer to 2 micrometers, which is sufficient to assure good conductivity for most applications.

During electroplating, the titanium surface is usually protected by a second photoresist layer, as discussed in the Prior Art Section. Use of the inventive procedure prevents any substantial plating of gold onto titanium. Alternatively, the second photoresist layer may be eliminated, again, with the gold deposition occurring substantially only on the platinum regions, so long as the maximum permissible potential is not exceeded during the electrodeposition.

Figure 4:
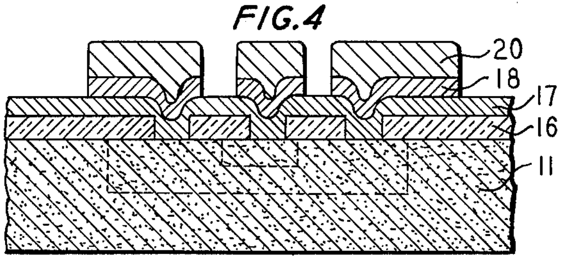
Figure 5:
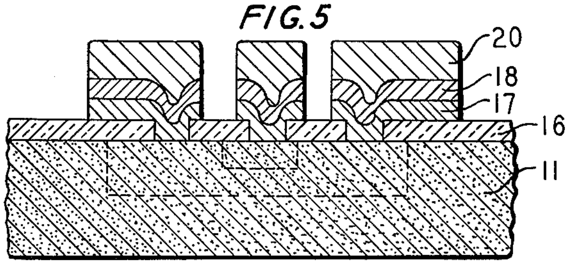

Following the gold electrodeposition, the results of which are shown in FIG. 4, the portions of the titanium layer not covered by the platinum-gold overlay are conveniently removed by conventional chemical etchants well-known in the art. In FIG. 5, a completed device, metallized in accordance with the invention, is shown.

2. Electrodeposition Procedure

Any of the gold plating baths employed commercially may be used. However, contrary to the usual practice, the disclosed plating process is dependent, at least initially, on potential, rather than on current. Specifically, in order to plate gold only onto platinum or palladium and not onto titanium, the potential at the titanium layer must not exceed a maximum value. The maximum potential that may be attained during plating is dependent on several factors, including cell configuration, composition and pH of the plating solution, and agitation rate of the plating solution. Thus, for a given set of conditions, the practitioner must experimentally determine the maximum plating potential such that platinum or palladium, and not titanium, is gold plated.

The maximum plating potential is determined as follows. A bi-metal surface (platinum-titanium; palladium-titanium), in which the metals are electrically shorted, is immersed in a gold electroplating solution, and a constant cathodic potential is applied to the bimetal surface until a desired gold thickness is achieved on the platinum or palladium regions. The procedure is repeated for several bi-metal surfaces at different constant potentials. The resultant gold plated surfaces are examined microscopically for any traces of gold plating on titanium to determine the maximum potential value to be employed. It is observed that as the potential becomes more cathodic, such traces of gold plating, called nucleation sites, appear. However, so long as the nucleation sites do not interfere with chemical etching, they pose little problem when present in relatively small numbers (about 5000 nucleation sites per square centimeter), since such sites fall away from the bimetal surface when the portions of the titanium layer not covered by platinum or palladium are subsequently removed by the etching.

It is convenient for the practice of the invention to employ a three-electrode system in conjunction with a commercially available potentiostat to perform the electrodeposition. While two-electrode arrangements may be used, they are not as practical, due to controllable anode potentials that vary as a result of several factors, including agitation rates, dissolved oxygen, gold depletion, etc. On the other hand, potentiostats may be used to control potentials in three-electrode arrangements consisting of a working electrode, a counter electrode, and a reference electrode, all immersed in the plating solution. The potential of the working electrode, here the bi-metal surface, is constantly monitored by the reference electrode. The potentiostat adjusts the applied current between the working electrode and the counter electrode to maintain the potential of the working electrode constant with respect to the reference electrode. Platinum foil is conveniently employed as the counter electrode. Examples of reference electrodes include the calomel electrode (mercurous chloride in contact with mercury, both immersed in an aqueous potassium chloride solution of known concentration) and the silver-silver chloride electrode (silver chloride in contact with silver, both immersed in hydrochloric acid). Potentiostats are described in detail elsewhere and hence do not form a necessary part of this disclosure; see, e.g., Vol. 35, *Analytical Chemistry*, pp. 1770–1778 (1963).

3. Example

Bi-metal surfaces (platinum-titanium; palladium-titanium), which resulted from processing silicon integrated circuits, were gold plated under conditions in which the potential, for a particular sample, was held constant, relative to a saturated calomel reference electrode (SCE), but was varied from sample to sampel. A platinum foil counter electrode was employed. The effect of applying such potentials to bi-metal surfaces in creating gold nucleation sites on titanium is shown in the Table below. The pH value of 7.5 was obtained using an aqueous bath composed of 20 g/l of $KAu(CN)_2$ and 50 g/l of citric acid, and adjusting to a pH of 7.5 with KOH. The pH values of 8 and 10 were obtained using an aqueous bath composed of 20 g/l of $KAu(CN)_2$, 40 g/l of $K_2HPO_4.3H_2O$ and 10 g/l of $KH_2PO_4$, and adjusting the pH with KOH.

Table. Study of Nucleation of Au on Ti at Constant Potential (relative to SCE)

| Surface | pH | Applied Potential, Millivolts | Nucleation on Ti |
|---|---|---|---|
| Pt-Ti | 7.5 | −600 | very slight |
| | | −650 | slight to moderate |
| | 8 | −700 | very slight |
| | | −750 | slight |
| | | −800 | moderate |
| | 10 | −700 | very slight |
| | | −750 | very slight |
| | | −800 | moderate |
| Pd-Ti | 7.5 | −550 | very slight |
| | | −600 | slight to moderate |
| | 8 | −650 | very slight |
| | | −700 | slight |
| | | −750 | extensive |
| | | −800 | very extensive |
| | 10 | −600 | none |
| | | −700 | very slight |
| | | −750 | very slight |
| | | −800 | very extensive |

Note: Very slight means less than 5000 sites/cm², and slight means less than 50,000 sites/cm², with the sites usually less than 1 micrometer in diameter.

It can be seen from the Table that at the more cathodic values, a greater number of nucleation sites on titanium appear. Also, an increase in pH shifts the maximum potential that can be tolerated to more cathodic values.

Since higher potentials reduce the time required for plating, it is desirable to employ the highest potential consistent with minimum nucleation site formation. Defining the absence of gold plating as less than 5000 gold nucleation sites per square centimeter on titanium, then in the pH range of 7.5 to 10, the maximum potential that may be employed ranges from about −750 millivolts to −950 millivolts for a platinum-titanium bi-metal surface, and from about −700 millivolts to −950 millivolts for a palladium-titanium bimetal surface, with the more cathodic values associated with the higher pH values.

The maximum potential values are also dependent on other factors, as noted above, and it is anticipated that such factors as additions to or alterations in plating bath compositions may vary the maximum potential values by as much as about 25 percent. Consistent with this, the maximum potential that may be employed ranges from about −750 millivolts to −935 millivolts for a platinum-titanium bi-metal surface in the pH range of 7.5 to 10, and from −690 millivolts to −935 millivolts for a palladium-titanium bi-metal surface in the same pH range.

What is claimed is:

1. A method of electrodepositing from solution a gold layer onto a platinum of palladium layer, where the platinum or palladium layer covers portions of a titanium layer, leaving portions of the titanium layer exposed to the solution, characterized in that the titanium layer is biased cathodic with respect to an immersed counter electrode, such that the cathode potential at the titanium layer does not exceed a maximum value during electrodeposition, whereby the gold selectively deposits substantially only on the platinum or palladium layer.

2. The method of claim 1 in which the gold layer is electrodeposited onto a platinum layer.

3. The method of claim 2 in which the value of maximum potential at the titanium layer ranges from about −750 millivolts to −950 millivolts (relative to a saturated calomel reference electrode) in the pH range of 7.5 to 10.

4. The method of claim 1 in which the gold layer is electrodeposited onto a palladium layer.

5. The method of claim 4 in which the value of the maximum potential at the titanium layer ranges from about −700 millivolts to −950 millivolts (relative to a saturated calomel reference electrode) in the pH range of 7.5 to 10.

6. The method of claim 1 in which the titanium layer covers a semiconductor body.

7. The method of claim 6 including the steps of (a) depositing an oxide on a semiconductor surface, (b) forming apertures therethrough to expose a portion of the surface (c) depositing the titanium layer on the surface of the oxide, (d) depositing the platinum of palladium layer onto portions of the titanium layer, leaving portions of the titanium layer exposed, and (e) electrodepositing the gold layer onto the platinum or palladium layer.

8. The method of claim 7 in which a photoresist layer is formed on the exposed portions of the titanium layer prior to the electrodeposition.

9. The method of claim 1 in which the value of the cathode potential is maintained by a procedure which includes monitoring the potential at the titanium layer relative to a reference electrode and adjusting the applied current between the titanium layer and the counter electrode.

* * * * *

UNITED STATES PATENT AND TRADEMARK OFFICE
CERTIFICATE OF CORRECTION

PATENT NO. : 3,926,747

DATED : December 16, 1975

INVENTOR(S) : Kenneth R. Newby and Earl D. Winters

It is certified that error appears in the above-identified patent and that said Letters Patent are hereby corrected as shown below:

Column 2, line 5, "employed" should be --employing--; line 12, "invention" should be --inventive--. Column 4, line 30, after "Bi-metal" insert --metal--; line 35, "sampel" should be --sample--.

Signed and Sealed this

Thirty-first Day of August 1976

[SEAL]

*Attest:*

RUTH C. MASON
*Attesting Officer*

C. MARSHALL DANN
*Commissioner of Patents and Trademarks*